United States Patent
Barna

(10) Patent No.: US 7,344,957 B2
(45) Date of Patent: Mar. 18, 2008

(54) SOI WAFER WITH COOLING CHANNELS AND A METHOD OF MANUFACTURE THEREOF

(75) Inventor: Gabriel G. Barna, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 11/038,872

(22) Filed: Jan. 19, 2005

(65) Prior Publication Data

US 2006/0160327 A1    Jul. 20, 2006

(51) Int. Cl.
*H01L 21/30* (2006.01)
*H01L 21/46* (2006.01)

(52) U.S. Cl. .............. 438/455; 257/E21.563; 257/E21.562

(58) Field of Classification Search ............... 438/455, 438/149, 150; 257/E21.568, E21.237, E21.567, 257/E21.563, E21.562
See application file for complete search history.

(56) References Cited

U.S. PATENT DOCUMENTS

| | | | |
|---|---|---|---|
| 4,950,354 A * | 8/1990 | Schirmer | 156/145 |
| 4,954,458 A | 9/1990 | Reid | |
| 5,091,330 A | 2/1992 | Cambou et al. | |
| 5,374,564 A | 12/1994 | Bruel | |
| 6,020,252 A | 2/2000 | Aspar et al. | |
| 6,191,007 B1 * | 2/2001 | Matsui et al. | 438/459 |
| 6,219,237 B1 * | 4/2001 | Geusic et al. | 361/699 |
| 6,242,778 B1 | 6/2001 | Marmillion et al. | |
| 6,335,258 B1 * | 1/2002 | Aspar et al. | 438/406 |
| 6,372,609 B1 | 4/2002 | Aga et al. | |
| 6,770,506 B2 * | 8/2004 | Gogoi | 438/52 |
| 6,770,507 B2 * | 8/2004 | Abe et al. | 438/64 |
| 6,818,817 B2 * | 11/2004 | Macris | 136/201 |
| 7,112,850 B2 * | 9/2006 | Hughes et al. | 257/349 |
| 2004/0171232 A1 | 9/2004 | Cayrefourcq et al. | |
| 2005/0266653 A1 * | 12/2005 | Moriwaki | 438/406 |
| 2006/0014330 A1 * | 1/2006 | Ichikawa et al. | 438/149 |
| 2006/0118935 A1 * | 6/2006 | Kamiyama et al. | 257/684 |

* cited by examiner

*Primary Examiner*—Michael Lebentritt
*Assistant Examiner*—Thu-Huong Dinh
(74) *Attorney, Agent, or Firm*—Jacqueline J. Garner; W. James Brady, III; Frederick J. Telecky, Jr.

(57) ABSTRACT

A method (100) of forming a silicon-on-insulator (SOI) wafer includes forming one or more channels in a top surface of a first wafer (104), and forming an insulator layer on a second wafer (106). The second wafer is treated (108) to generate a structural weakness therein, and the first and second wafers together (110) are then bonded together so that the channels face the insulator layer. A portion of the second wafer is then removed (112) from the bonded first and second wafers at a location corresponding to the structure weakness.

8 Claims, 4 Drawing Sheets

SOI WAFER WITH COOLING CHANNELS AND A METHOD OF MANUFACTURE THEREOF

FIELD OF INVENTION

The present invention relates generally to semiconductor device starting material, and more particularly relates to a method of making an SOI wafer with cooling channels therein.

BACKGROUND OF THE INVENTION

Since the development of integrated circuit technology, semiconductor chips have been fabricated primarily on a mono-crystalline silicon wafer with active devices such as transistors and diodes fabricated near the top surface of the wafer. These chips often become hot during operation due to heat dissipation, especially in the case of high-density logic and microprocessor chips. Traditionally, one method for cooling the integrated circuit chips has been the attachment of external heat sinks to the backside of the chip, or to the module into which the chip is packaged. This technology is often referred to as bulk silicon technology.

A more recent technology called silicon-on-insulator, or SOI, utilizes a layer of mono-crystalline silicon stacked on top of an insulator, typically silicon oxide, which itself is stacked on top of a thick substrate, most often a silicon wafer. Several methods of fabricating such SOI wafers involve bonding together two wafers, for example, a method in which each wafer has an oxidized surface, and the wafers are bonded together, oxidized surface to oxidized surface, to form the middle insulating silicon oxide. The bonding is followed by thinning the backside of one of the wafers so as to form a thin mono-crystalline silicon uppermost layer, with the other wafer becoming the lowermost layer of the stacked SOI wafer. The active devices are fabricated in the uppermost, thin monocrystalline silicon layer of the wafer stack.

Another feature of SOI technology is the ability to form isolated pockets of mono-crystalline silicon in the upper thin mono-crystalline silicon layer by etching down to the middle insulating layer, and then back filling with an insulator such as silicon oxide, or by other methods. In the above manner various active area portions of the wafer are effectively isolated from one another without the potential for any latch-up conditions.

In this newer SOI technology, cooling of the chip still utilizes the methods applied to conventional chips fabricated with bulk silicon technology. One problem with the existing cooling techniques, however, is that the heat generated from any individual device or group of devices typically must travel from the device junctions through the bulk silicon to the backside of the chip where the heat sink operates to conduct the heat away therefrom. The effectiveness of cooling a single device or group of devices is affected by the cooling of the chip as a whole. For SOI, added to this problem is the fact that SOI devices are generally designed to run faster and can therefore generate more heat than devices on conventional bulk substrate material. If the heat could be conducted away directly at or very near to the device junctions, individual devices or groups running very hot could be cooled more effectively.

Therefore there is a need in the art for a method of making SOI starting material that is conducive to removing the heat of semiconductor devices fabricated thereon.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. The invention relates to a method of forming an SOI wafer having cooling channels therein. The cooling channels are operable to remove the heat dissipated by integrated circuits devices fabricated thereon.

According to one aspect of the present invention, a method of forming an SOI wafer having cooling channels formed therein is disclosed. The method comprises forming one or more cooling channels in a top surface of a first wafer, and forming a dielectric layer that will serve as the insulating layer on a top surface of a second wafer. The second wafer is treated to generate a structural weakness therein at a predetermined depth below the dielectric layer, and the top surfaces of the first and second wafers are then bonded together such that the cooling channels face the dielectric layer. A portion of the second wafer is then removed from the bonded wafer combination at a location generally corresponding to the structural weakness location. The remaining structure corresponds to a semiconductor layer (second wafer) overlying an insulating layer (second wafer) that in turn overlies a bulk semiconductor substrate (first wafer) having cooling channels therein. The cooling channels are proximate to the insulating layer, and operable to facilitate an efficient removal of heat from a device built thereon.

According to another aspect of the present invention, one or more cooling channels are formed on a top surface of the first wafer. In one example, such cooling channels are formed using a patterned etch mask overlying the first wafer such as an exposed and developed photoresist or other type mask. Using the patterned mask, an etch of the first wafer is performed, wherein one or more channels are formed in the top surface of the first wafer. Alternatively, the channels are formed via an electron beam, or an exaggerated scratching of the first wafer surface, thereby generating channels therein. The channels may then be employed to facilitate an efficient removal of heat from a completed device, wherein a cooling fluid may pass therethrough to carry away such heat.

According to another aspect of the invention, the dielectric layer is formed on a top surface of the second wafer by placing the entire wafer into an oxidizing ambient, wherein the entire second wafer becomes oxidized. Alternatively, an oxide or other type dielectric layer may be thermally formed or otherwise deposited, and all such formation methodologies are contemplated herein.

According to still another aspect of the present invention, the second wafer is treated to generate a structure weakness therein at a predetermined depth below the dielectric layer by subjecting the second wafer to a suitable ion implantation. For example, the second wafer is bombarded with hydrogen ions or ions of a rare gas at a predetermined energy level that dictates a depth in which the structural weakness forms in the second wafer. The hydrogen ions cause a layer of micro-bubbles to form in the second wafer, wherein the micro-bubbles cause the wafer to experience a structural weakness thereat at a depth that is a function of the implant energy.

The structural weakness degrades the integrity of the second wafer, however, the second wafer stays intact while the first and second wafers are bonded together. The top surfaces of the first and second wafers are brought together, and since, in one example, the top surface of the first wafer is silicon and the top surface of the second wafer is an oxide, the two wafers readily bond together. A thermal process is then initiated, wherein the micro-bubbles in the second wafer substantially coalesce, and the silicon lattice is rearranged, wherein a portion of the second wafer corresponding to the micro-bubble layer delaminates from the first and second bonded wafers.

According to yet another aspect of the present invention, a surface treatment is performed on the portion of the second wafer remaining bonded to the first wafer. In one example, the surface treatment comprises a planarization thereof, for example, by polishing to remove the surface roughness associated with the delamination. Alternatively, the exposed second wafer surface is oxidized to form a sacrificial oxide thereon, and the sacrificial oxide is then removed, thereby removing any damage associated with the delamination. Alternatively, or in addition, the second wafer surface may be exposed to a reducing ambient, wherein damage associated with the surface is repaired.

The resultant structure provides a silicon layer overlying a buried oxide, which in turn overlies a bulk silicon substrate that has cooling channels formed therein that effectively operate to channel heat away from devices formed thereon.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
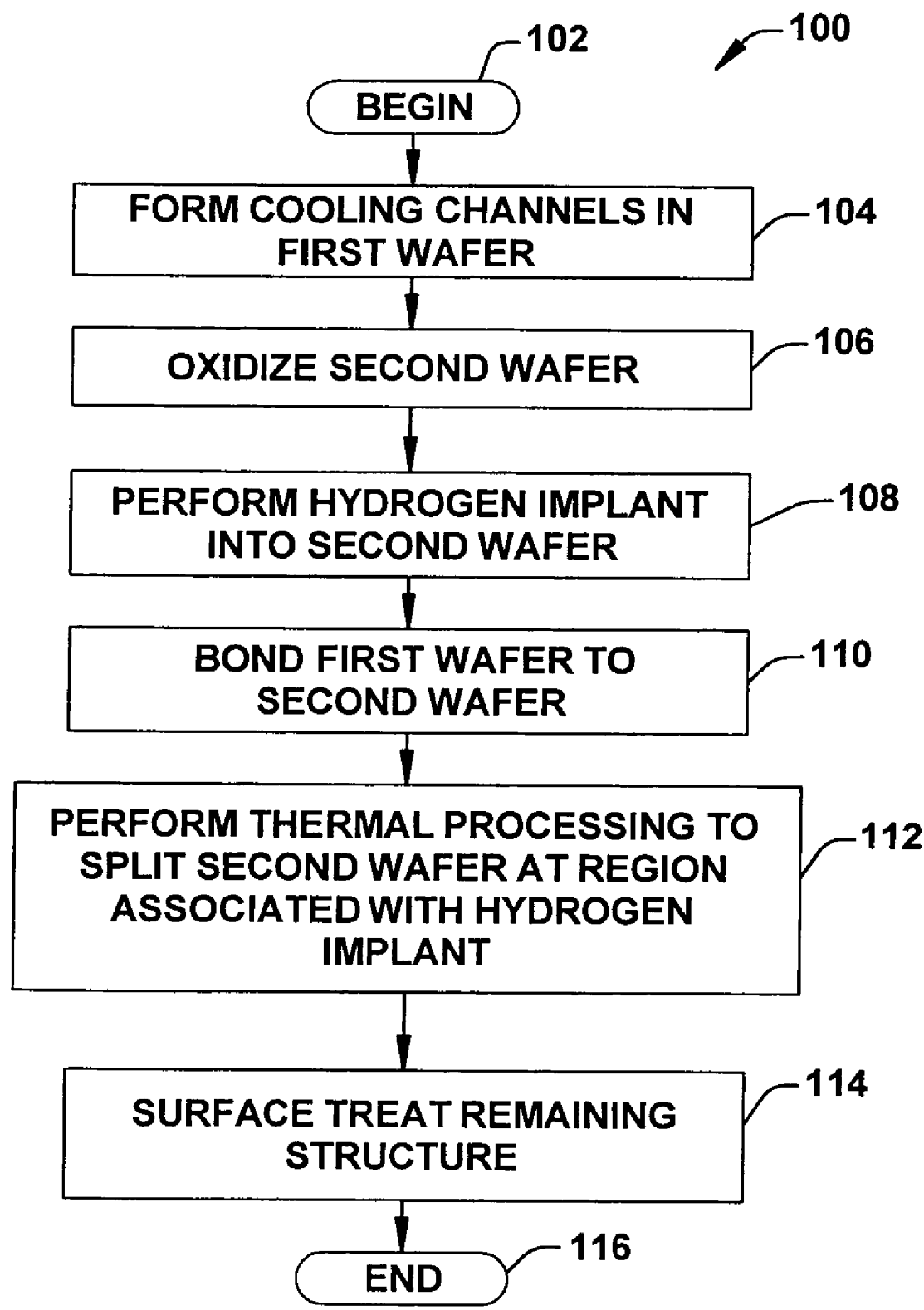
FIG. 1 is a flow chart diagram illustrating a method of forming a silicon-on-insulator (SOI) wafer in accordance with one or more aspects of the present invention.

One or more implementations of the present invention will now be described with reference to the attached drawings, wherein like reference numerals are used to refer to like elements throughout. The invention relates to a method of forming an SOI wafer having cooling channels formed therein. The cooling channels facilitate an efficient removal of heat from devices formed on the wafer.

Turning now to FIG. 1, a method of forming an SOI wafer having cooling channels is illustrated and designated at reference numeral 100. Although the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. The methods of the present invention, moreover, may be implemented in association with the devices illustrated and described herein as well as in association with other devices and systems not illustrated.

The method 100 begins at 102 and cooling channels are formed in a first wafer at 104, for example, on a top surface thereof. A second wafer is processed at 106, wherein the second wafer is processed to form a dielectric layer on a top surface thereof. For example, act 106 may comprise an oxidation of the second wafer. An implant is performed into the second wafer at 108 to create a structural weakness therein. For example, a hydrogen implant may be performed into the second wafer through the formed dielectric layer at 108, wherein the hydrogen implant causes a layer of microbubbles to form in the second wafer at a depth generally associated with the hydrogen implantation energy. The large number of micro-bubbles causes a structural weakness in the second wafer at the specified depth due to the large number of small voids thereat.

The method 100 continues at 110, wherein the top surfaces of the first and second wafers are bonded together. In one example, since the top surfaces of the first and second wafers are silicon and oxide, respectively, the wafers bond together at room temperature without any special bonding or adhesives being added. Alternatively, however, any method for bonding the wafers together may be employed and is contemplated by the present invention. The second wafer is then split at 112 along the region having the structural weakness thereat, thereby delaminating a part of the second wafer from the bonded first and second wafers. In one example, the second wafer is split by performing a thermal process in which the bonded first and second wafers are exposed to a temperature of about 500° C. or more. At the elevated temperature, the micro-bubbles in the second wafer coalesce, thereby forming one or more macro-bubbles that cause the portion of the second wafer to delaminate from the bonded first and second wafer.

The remaining portion of the second wafer that remains bonded to the first wafer has a silicon thickness that generally corresponds to a depth of the structural weakness that was formed therein. For example, when hydrogen ion implantation is used to generate the structural weakness, the depth of the remaining silicon of the second wafer generally corresponds to the depth of the hydrogen implant, and thus to the energy of the hydrogen implantation. The remaining silicon layer overlies the dielectric layer that, in turn, overlies the first wafer bonded thereto that has one or more cooling channels formed therein.

The method 100 may then conclude at 114 and 116 by a surface treatment of the exposed portion of the second wafer after the delamination process. As may be appreciated, after a portion of the second wafer is removed, the remaining portion overlying the dielectric layer has damage associated therewith, for example, a surface roughness, etc. Various types of surface treatment may be performed in order to remove or reduce such damage such that the remaining second wafer silicon material will be acceptable as monocrystalline silicon material for fabrication of active devices therein. In one example, the surface treatment 114 comprises a planarization of the damaged surface. For example, a planarization process comprising a chemical-mechanical polish (CMP) may be performed followed by a clean, whereby a portion of the damaged material is physically removed. Alternatively, the exposed second wafer surface may be oxidized to form a sacrificial oxide, and the sacrificial oxide is then removed, thereby removing delamination damage. In yet another alternative, the second wafer surface may be exposed to a reducing ambient, wherein damage therein is removed or reduced.

Figure 2:
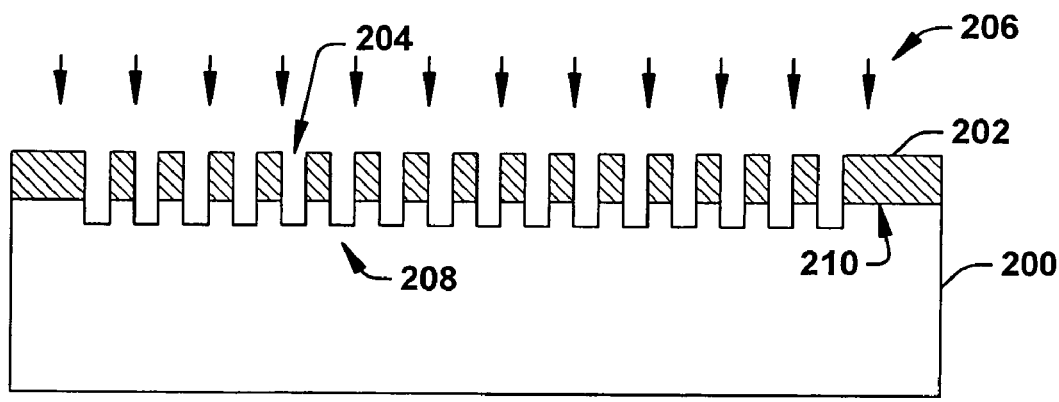
FIG. 2 is a cross section diagram illustrating a first wafer having one or more channels formed therein according to an aspect of the present invention.

Turning now to FIGS. 2-8, various details and alternative embodiments of the method of FIG. 1 are illustrated in greater detail. For example, FIG. 2 is a cross section diagram illustrating one exemplary manner of forming one or more cooling channels in a first wafer (e.g., 104 of FIG. 1) according to the invention. In FIG. 2, a first wafer 200, for example, a silicon wafer, has an etch mask 202 formed thereon. In one example, the etch mask comprises an exposed and developed photoresist layer having a plurality of openings 204 therein. Alternatively, the etch mask may be a patterned oxide or nitride or other suitable mask layer. An etch process 206 is then performed, for example, a generally anisotropic dry etch, to thereby form a plurality of channels 208 in a top surface 210 of the first wafer 200 and the mask 202 is removed, for example, with a wet etch or ash operation. In another alternative embodiment of the present invention, the one or more cooling channels 208 may be formed by any means, such as by etching via a molecular or electron beam or by an exaggerated scratching of the top surface thereof. Any manner of forming grooves, trenches, etc. may be employed and is contemplated as falling within the scope of the present invention. In addition, any type of channel pattern in the top surface 210 may be made and is contemplated by the invention.

Figure 3:
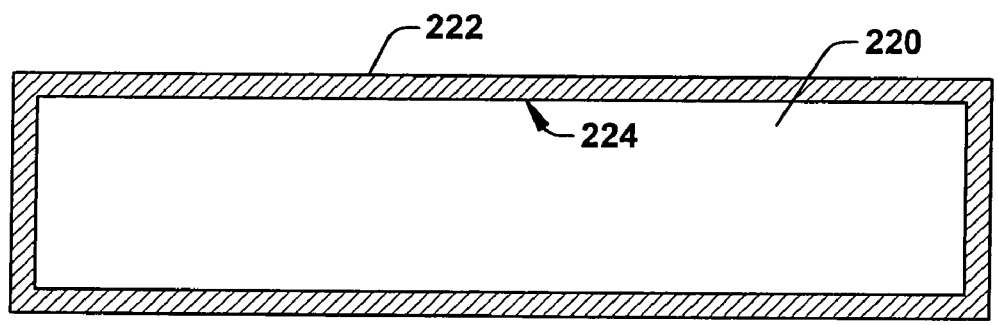
FIG. 3 is a cross section diagram illustrating a second wafer having an oxidized surface formed thereon according to an aspect of the present invention.

A second wafer 220 is then processed so as to form a dielectric layer on a top surface thereof (e.g., 106 of FIG. 1). For example, as illustrated in FIG. 3, the second wafer 220 is oxidized by placing the wafer in an oxidizing ambient such as a thermal processing chamber that contains oxygen. In the example of FIG. 3, the dielectric layer 222 is an oxide having a thickness of between about 0.1 micron and about 2.0 microns that is grown on all surfaces of the wafer 220, and thus also resides on a top surface 224 thereof. Other dielectric thicknesses may also be employed. Alternatively, the oxide may be deposited or otherwise formed, for example, via a chemical vapor deposition process, wherein the oxide is formed on the top surface 224 of the second wafer 220. Further, although in a preferred embodiment of the invention, the dielectric layer 222 is an oxide, to the extent that SOI wafers may utilize other types of dielectric materials for the buried oxide, the present invention contemplates the formation of other dielectric materials, and such alternatives are contemplated as falling within the scope of the present invention.

Figure 4:
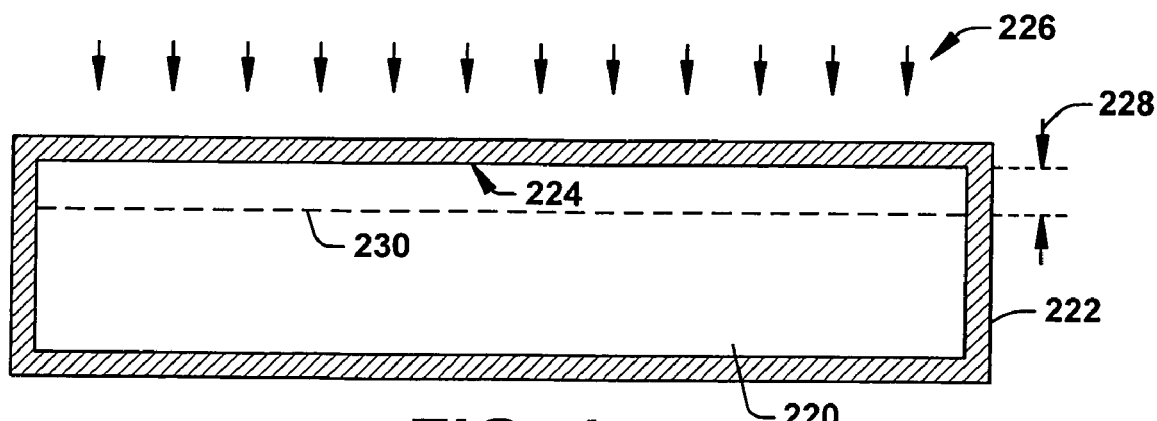
FIG. 4 is a cross section diagram illustrating an implantation of the second wafer to form a structural weakness therein according to an aspect of the present invention.

Turning to FIG. 4, a structural weakness is imparted or formed in the second wafer 220 (e.g., 108 of FIG. 1). In one exemplary embodiment of the invention, the structural weakness is generated in the second wafer by implanting hydrogen ions or ions of a rare gas into the second wafer 220 via an implantation process 226. Based on an energy of the implant, hydrogen ions extend, on average, into the top surface 224 of the second wafer 220 to a predetermined depth 228, thereby creating a micro-bubble layer 230 therein that extends generally parallel to the top surface 224. The micro-bubble layer 230 extends across a lateral extent of the second wafer 220 and causes a structural weakness therein, wherein the wafer is prone to separation thereat if subjected to one or more forces thereon or subjected to processes thereto, as will be described in greater detail infra. While the structural weakness comprises a micro-bubble layer 230 generated via implantation in the above embodiment, it should be appreciated that other processes or mechanisms by which a structural weakness may be imparted to the second wafer 220 may be employed and is contemplated as falling within the scope of the present invention.

Figure 5:
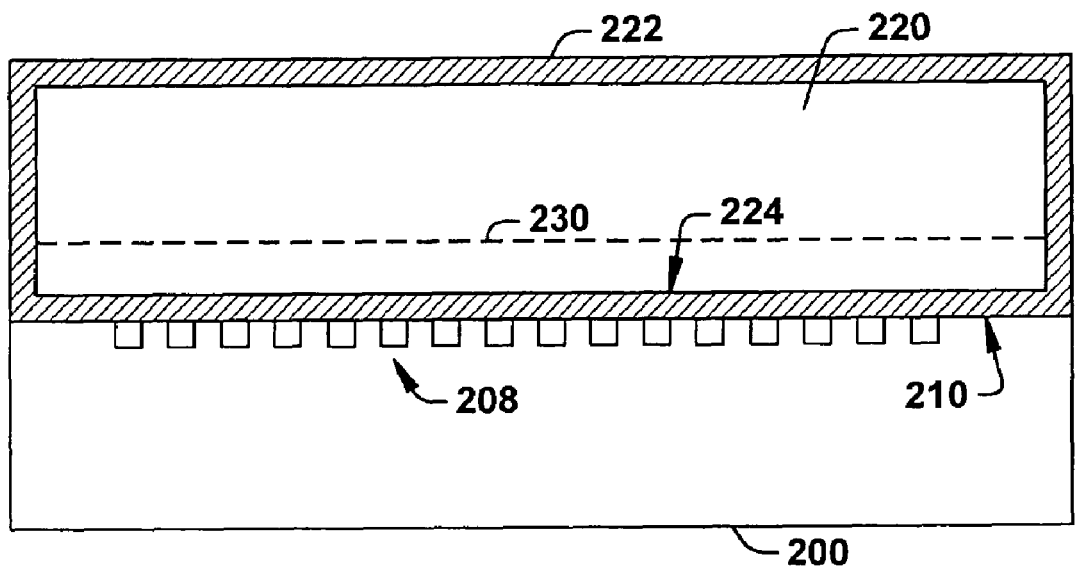
FIG. 5 is a cross section diagram illustrating a bonding of the first and second wafers according to an aspect of the present invention.

The first and second wafers 200, 220 are then bonded together (e.g., 110 of FIG. 1), as illustrated in FIG. 5. In the above example, the top surfaces 210, 224 of the first and second wafers 200, 220 are brought together and bonded, such that the dielectric layer 222 of the second wafer 220 is facing the one or more cooling channels 208 residing in the first wafer 200, as illustrated. When the dielectric layer 222 is an oxide, and the first wafer is a silicon substrate, the surfaces 210 and 224 will bond together upon being brought into contact with one another at room temperature in a clean atmosphere. Alternatively, other methods of bonding the two wafers 200, 220 may be employed and any such bonding process and/or bonding material is contemplated as falling within the scope of the present invention.

Figure 6:
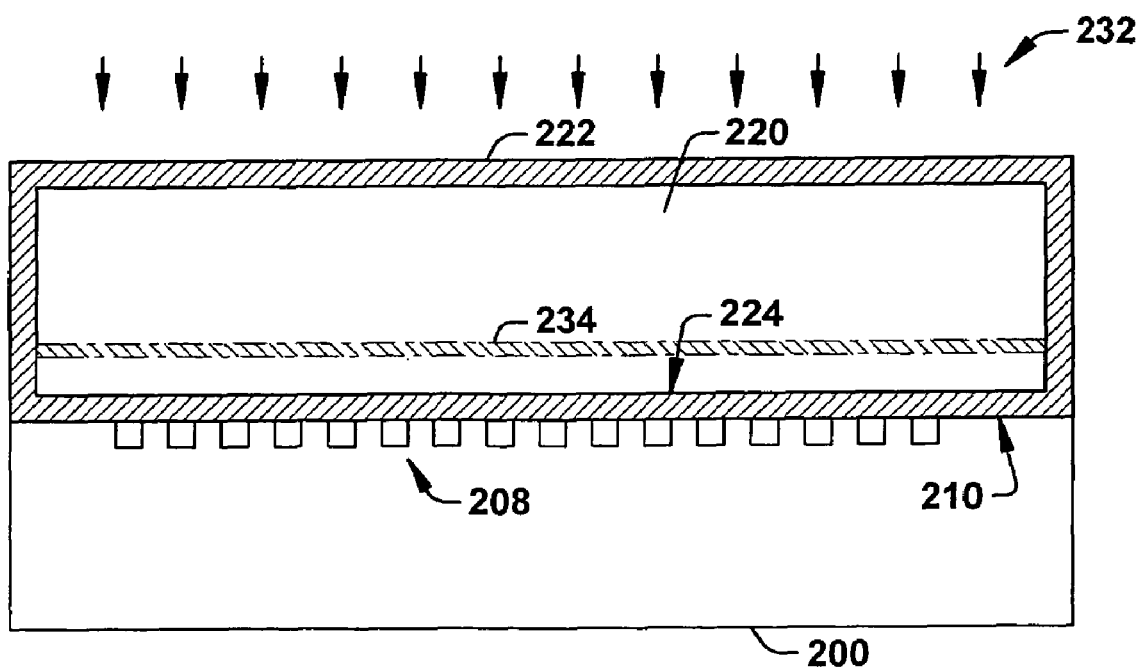
FIG. 6 is a cross section diagram illustrating a thermal treatment performed on the bonded first and second wafers to create a delamination of a portion of the second wafer from the bonded wafers according to an aspect of the present invention.

The bonded first and second wafers are then split along the structural weakness area of the second wafer 220 (e.g., 112 of FIG. 1). In one preferred embodiment of the present invention, a thermal process 232 is employed, in which the bonded first and second wafers 200, 220 are subjected to an elevated temperature of about 500° C. or more in an inert atmosphere. At the elevated temperature, the crystalline structure of the silicon is re-arranged, and the micro-bubble layer 230 is altered, wherein the micro-bubbles therein tend to coalesce into one or more macro-bubbles 234 due to bubble cohesion as illustrated in FIG. 6, thereby causing a separation thereat. In other words, the thermal processing causes a delamination of a portion 236 of the second wafer 220 opposite the top surface 224 from the bonded first and second wafers 200, 220. An exemplary illustration of the delamination is provided in FIG. 7, wherein the portion 236 of the second wafer 220 is removed, while another portion 238 associated with a top surface 224 of the second wafer 220 remains bonded to the first wafer 200, as illustrated. A further optional bonding heat treatment may then be performed to achieve improved bonding strength, for example, exposure in an inert atmosphere at a temperature of about 1,000-1,300° C. for a time period of between about 30 minutes and 2 hours.

Figure 7:
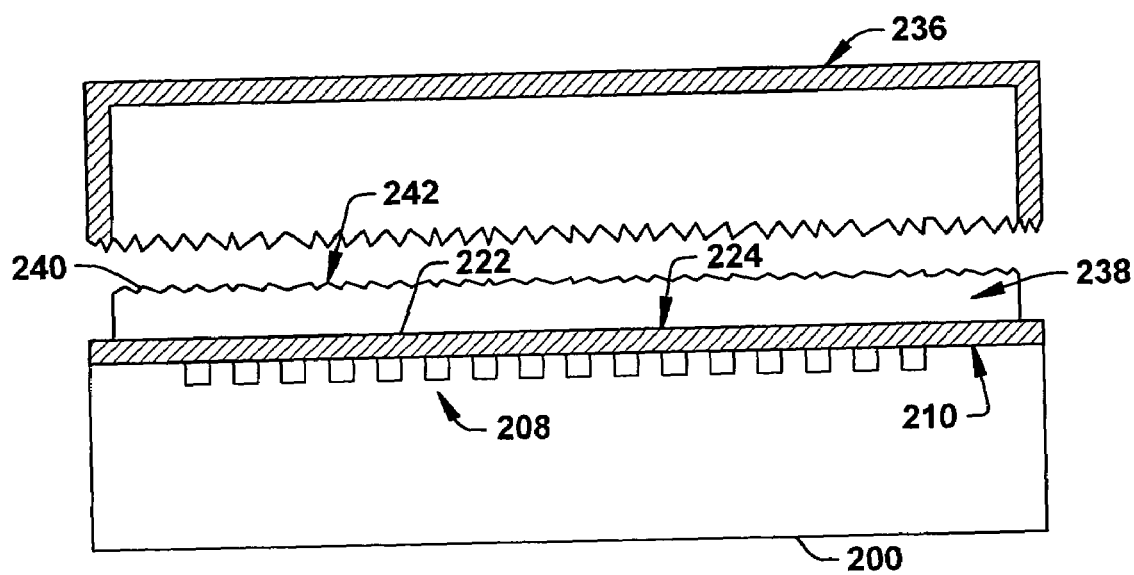
FIG. 7 is a cross section diagram illustrating the delamination of the portion of the second wafer from the bonded first and second wafer according to an aspect of the present invention.

As can be seen in FIG. 7, the remaining portion 238 of the second wafer and the first wafer 200 that are still bonded together may be employed as SOI starting material, wherein the first wafer 200 having the cooling channels 204 therein comprises the bulk substrate, the dielectric layer 222 forms the buried oxide, and the remaining portion 238 of the second wafer 220 comprises the SOI, wherein active devices may be formed. In the above manner a surface 240 associated with the delamination becomes a top surface 242 of an SOI wafer 244. The delamination process, however, tends to result in damage to the surface 240, and therefore a subsequent surface treatment thereto is contemplated in one exemplary embodiment of the present invention.

Figure 8:
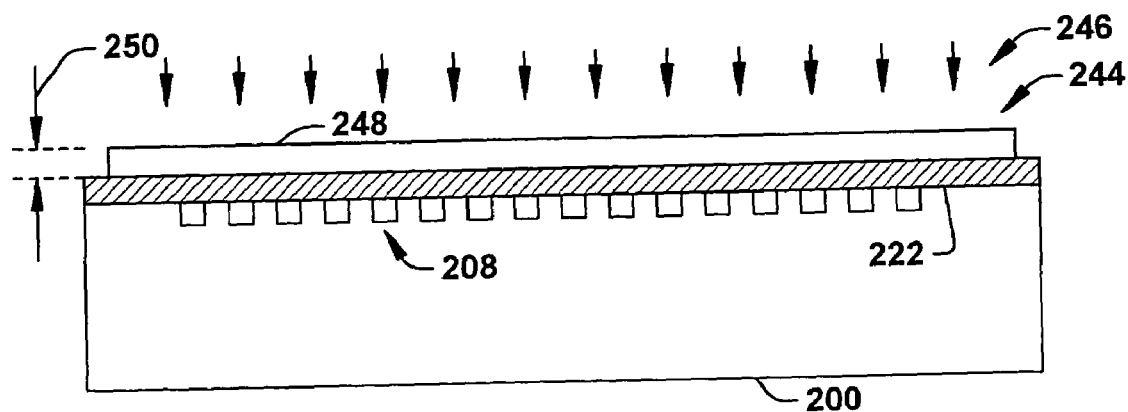
FIG. 8 is a cross section diagram illustrating a surface treatment performed on the exposed portion of the second wafer still bonded to the first wafer, wherein the remaining second wafer portion comprises a silicon layer overlying a buried oxide layer that in turn overlies one or more cooling channels according to the present invention.

A surface treatment of the SOI wafer 244 (e.g., 114 of FIG. 1) to remove surface damage associated with the surface 240 of FIG. 7 is illustrated in FIG. 8 at reference numeral 246. In one example, the surface treatment 246 comprises a planarization of the surface 240 such as chemical-mechanical polishing (CMP), wherein silicon material is removed. Although such a process does serve to remove some damage, a thickness uniformity of the remaining silicon material 248 tends to be degraded. Consequently, another alternative surface treatment comprises an oxidation of the surface 240 to form a sacrificial oxide (not shown) that incorporates the damage therein, followed by a removal of the sacrificial oxide via, for example, a wet etch such as HF. The oxidation tends to consume some of the damaged silicon, and then removal of the sacrificial oxide results in the remaining silicon material 248 having fewer defects. In another alternative, the surface treatment 246 may comprise an exposure of the SOI wafer 244, and particularly the surface 240 to a reducing ambient at an elevated temperature, wherein such treatment tends to remove or reduce surface damage in the material 248. Such treatment may be performed alone or in conjunction with other surface treatments such as the sacrificial oxide formation and removal process.

Upon a completion of the surface treatment 246, an SOI wafer 244 is provided in which the active silicon area 248 has a thickness 250 over the dielectric layer, for example, buried oxide 222. The buried oxide 222 resides over the bulk silicon substrate 200 having one or more cooling channels 208 formed therein that may be utilized to efficiently remove heat generated in a subsequently formed integrated circuit device. For example, a cooling fluid may be passed through such channels 208, wherein the fluid carries away the heat generated via power dissipation in the circuits in a manner that is more efficient that conventional methods that relied solely on heat sinks coupled to the devices.

In addition, the formation of the cooling channels 208 in the manner described above, in which a structural weakness is induced and then delamination effectuated, rather than merely performing a substantial polishing of the second wafer results in a process with substantially greater throughput and substantially improved SOI thickness uniformity of region 248.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming a silicon-on-insulator wafer having one or more cooling channels underlying a buried oxide layer therein, comprising:
    forming one or more cooling channels on a top surface of a first wafer;
    forming a buried oxide layer on a top surface of a second wafer;
    forming a micro-bubble layer below the buried oxide layer in the second wafer, wherein a depth of the micro-bubble layer below the buried oxide layer generally corresponds to a desired depth of silicon overlying the buried oxide layer of the resulting silicon-on-insulator wafer;
    bonding the top surface of the first wafer to the top surface of the second wafer, wherein the one or more cooling channels abut the buried oxide layer;
    splitting the second wafer along the micro-bubble layer therein, resulting in a portion of the second wafer overlying the buried oxide layer, which is turn overlies the one or more channels of the first wafer; and
    surface treating the portion of the second wafer.

2. The method of claim 1, wherein surface treating the portion of the second wafer comprises substantially planarizing the portion of the second wafer.

3. The method of claim 1, wherein surface treating the portion of the second wafer comprises;
    oxidizing an exposed surface of the second wafer portion as a sacrificial oxide; and
    removing the sacrificial oxide.

4. The method of claim 1, wherein forming the micro-bubble layer comprises implanting the top surface of the second wafer with hydrogen ions or ions of a rare gas, wherein the implantation causes a layer of micro-bubbles to form therein at an average depth associated with an implantation energy, and wherein the average depth corresponds to the desired depth.

5. The method of claim 4, wherein splitting the second wafer comprises exposing the bonded first and second wafers to a temperature sufficient to causes micro-bubbles in the micro-bubble layer to coalesce, thereby resulting in a delamination of the second wafer portion along the micro-bubble layer.

6. The method of claim 5, wherein the temperature is about 500° C. or greater.

7. The method of claim 1, wherein forming the buried oxide layer comprises exposing the second wafer to an oxidizing ambient.

8. A method of forming a silicon-on-insulator wafer having one or more cooling channels underlying a buried oxide layer therein, comprising:
    forming one or more channels on a top surface of a first wafer;
    forming a buried oxide layer on a top surface of a second wafer;
    forming a micro-bubble layer below the buried oxide layer in the second wafer, wherein a depth of the micro-bubble layer below the buried oxide layer generally corresponds to a desired depth of silicon overlying the buried oxide layer of the resulting silicon-on-insulator wafer;

bonding the top surface of the first wafer to the top surface of the second wafer, wherein the one or more channels abut the buried oxide layer;

splitting the second wafer along the micro-bubble layer therein, resulting in a portion of the second wafer overlying the buried oxide layer, which is turn overlies the one or more channels of the first wafer; and surface treating the portion of the second wafer, wherein surface treating the portion of the second wafer comprises;

oxidizing an exposed surface of the second wafer portion as a sacrificial oxide; and removing the sacrificial oxide and wherein surface treating further comprises exposing the exposed surface wafer portion with a heat treatment in a reducing ambient after removing the sacrificial oxide.

* * * * *